(12) United States Patent
Matz et al.

(10) Patent No.: US 8,164,177 B2
(45) Date of Patent: Apr. 24, 2012

(54) ELECTRONIC COMPONENT MODULE AND METHOD FOR PRODUCTION THEREOF

(75) Inventors: Richard Matz, Bruckmühl (DE); Ruth Männer, Oberpframmern (DE); Steffen Walter, Oberpframmern (DE)

(73) Assignee: OSRAM AG, München (DE)

( * ) Notice: Subject to any disclaimer, the term of this patent is extended or adjusted under 35 U.S.C. 154(b) by 166 days.

(21) Appl. No.: 12/522,849

(22) PCT Filed: Jan. 10, 2007

(86) PCT No.: PCT/EP2007/050208
§ 371 (c)(1),
(2), (4) Date: Jul. 10, 2009

(87) PCT Pub. No.: WO2008/083853
PCT Pub. Date: Jul. 17, 2008

(65) Prior Publication Data
US 2010/0014253 A1    Jan. 21, 2010

(51) Int. Cl.
*H01L 23/00* (2006.01)

(52) U.S. Cl. .. 257/703; 257/706; 257/720; 257/E23.106

(58) Field of Classification Search .................. 257/703, 257/706, 720, E23.106
See application file for complete search history.

(56) References Cited

U.S. PATENT DOCUMENTS

| | | | | |
|---|---|---|---|---|
| 5,650,662 A | * | 7/1997 | Edwards et al. | 257/700 |
| 2002/0191378 A1 | * | 12/2002 | Suzuki et al. | 361/704 |
| 2007/0000688 A1 | * | 1/2007 | Mobley | 174/255 |

FOREIGN PATENT DOCUMENTS

| | | |
|---|---|---|
| DE | 198 46 638 | 4/2000 |
| EP | 1 202 345 | 5/2002 |
| EP | 1 737 034 | 12/2006 |
| JP | 10-139559 A | 5/1998 |
| JP | 2002-203932 A | 7/2002 |
| JP | 2003-218484 A | 7/2003 |

\* cited by examiner

*Primary Examiner* — Trung Q Dang
(74) *Attorney, Agent, or Firm* — Cozen O'Connor

(57) ABSTRACT

An electronic component module comprising at least one ceramic circuit carrier (2, 3) and a cooling device with at least one heat sink (4), a bonding region arranged between the ceramic circuit carrier (2, 3) and the cooling device adapted for bonding the circuit carrier (2, 3) to the cooling device (4). The bonding region (5, 7; 6, 8) comprises a bonding layer comprised of metal and a eutectic region (7, 8).

14 Claims, 2 Drawing Sheets

ELECTRONIC COMPONENT MODULE AND METHOD FOR PRODUCTION THEREOF

RELATED APPLICATIONS

This is a U.S. national stage of application No. PCT/EP2007/050208, filed on Jan. 10, 2007.

FIELD OF THE INVENTION

The invention relates to an electronic component module with at least one multilayered ceramic circuit carrier, and a cooling device with at least one heat sink. Furthermore, the invention also relates to a method for producing an electronic component module of this kind.

BACKGROUND OF THE INVENTION

Electronic component modules with a number of multilayered circuit carriers are known. These are produced, for example, by LTCC (Low Temperature Cofired Ceramics), which represents an efficient technology for producing ceramic circuit carriers from multiple individual layers. For this, ceramic unsintered green sheets are provided with openings for the electrical plated-through connections by punching out, the openings are filled with electrically conductive paste and the sheets are provided with planar conducting structures on their surface by the screen printing process. Numerous of these individual layers may be subsequently laminated one on top of the other and sintered at a relatively low temperature. The process produces multilayered, buried layout structures that can be used for the integration of passive circuit elements. In addition, this process can be used to create layout structures that have very good radiofrequency properties, are hermetically sealed and have good thermal resistance. With these properties, LTCC technology is suitable for applications in adverse environments, for example for sensors, in radio-frequency technology, for example in the mobile communications and radar sector, and in power electronics, for example in vehicle electronics, transmission and engine control. However, thermally demanding applications are often limited by relatively poor thermal conductivity of the material, which typically has a thermal conductivity of 2 W/m K. For the cooling of active semiconductor components, which are generally part of such LTCC modules as surface-mounted components, simple mounting of the LTCC substrate on a heat sink is inadequate. In particular, it is inadequate for an LTCC substrate to be soldered or adhesively attached to a heat sink, as described in J. Schulz-Harder et al.: "Micro channel water cooled power modules", pages 1 to 6, PCIM 2000 Nuremberg.

An LTCC ceramic is compatible with silver metallization in the standard process. A customary solution for LTCC substrates is therefore the integration of thermal vias. These are vertical plated-through connections filled with silver-filled conductive paste and serve primarily for heat removal. In this way, an average thermal conductivity of 20 W/m K can be achieved. In combination with silver-filled sheets, values of 90 W/m K and 150 W/m K are made possible in the vertical and horizontal directions, respectively. This is disclosed by M. A. Zampino et al.: "LTCC substrate with internal cooling channel and heat exchanger", Proc. Internat. Symp. on Microelectronics 2003, Internat. Microelectronics and Packaging Society (IMAPS) Nov. 18-20, 2003, Boston, USA.

A further solution is the mounting of semiconductor ICs (integrated circuits) with high heat loss, for example power amplifiers, in clearances in the LTCC board directly on the heat sink.

Also known are solutions that are based on the integration of liquid-filled channels. In this case, the cooling takes place by convection of a liquid with high thermal capacity, for example water, as described in the aforementioned prior art according to J. Schulz-Harder et al.: "Micro channel water cooled power modules", and furthermore in M. A. Zampino et al.: "Embedded heat pipes with MCM-C Technology", Proc. NEPCON West 1998 Conference Vol. 2, Reed Exhibition: Norwalk, Conn. USA 1998, pages 777-785, Vol. 2, (Conf. Anaheim, USA, Mar. 1-5, 1998).

A solution on this basis does not use the thermal capacity of the cooling liquid for the heat transfer but the latent heat of a phase transition. This is described in the aforementioned prior art according to M. A. Zampino et is al.: "LTCC substrates with internal cooling channel and heat exchanger" and in W. K. Jones et al.: "Thermal management in low temperature cofire ceramic (LTCC) using high density thermal vias and micro heat pipes/spreaders", Proc. Internat. Symp. on Microelectronics 2002, Internat. Microelectronics and Packaging Society (IMAPS), Mar. 10-13, 2002, Reno, USA. According to the prior art, the "heat pipes" explained there are used, for example, for the cooling of processors in compact computers, such as laptops for example.

Apart from these methods that are suitable for LTCC, the so-called direct copper bonding process is suitable and widely used for highly sintered aluminum oxide ceramic, in order to bond circuit carriers of sintered aluminum oxide directly to cooling foils of copper at approximately 1100° C. This is described in J. Schulz-Harder et al.: "Micro channel water cooled power modules" and J. Schulz-Harder et al.: "DBC substrate with integrated flat heat pipe", EMPC 2005, The 15th European Microelectronics and Packaging Conference & Exhibition, Jun. 12-15, 2005, Bruges, Belgium.

SUMMARY OF THE INVENTION

An object of the invention is to provide an electronic component module and a method for producing an electronic component module of this kind with which highly thermally conductive substrates can be stably bonded to a multilayered ceramic circuit carrier simply and effortlessly and the heat removal can be improved.

An electronic component module according to an embodiment of the invention comprises at least one ceramic multi-layered circuit carrier and a cooling device with at least one heat sink. Formed between the ceramic circuit carrier and the cooling device is a bonding region for bonding the circuit carrier to the cooling device, which bonding region comprises a bonding layer formed at least in part from metal and a eutectic region. In particular, the bonding region is formed such that the bonding layer formed at least in part from metal is formed for bonding to a ceramic material, in particular the ceramic multilayered circuit carrier. Such a configuration allows a mechanically stable multilayered bonding region to be achieved between the circuit carrier and the cooling device, which region can additionally be produced effortlessly.

The eutectic region is preferably arranged between the bonding layer and the metallic cooling device. In particular in the case of a metallic cooling device, the eutectic region may form a special bond.

The bonding region is preferably formed over the full surface area between the circuit carrier and the cooling device. This makes simple and effortless application of the bonding region possible. However, it may also be provided that the bonding region is only formed in certain regions between the circuit carrier and the cooling device. In particular, it may be provided that specific local regions in which the bonding region is formed are provided. These specific regions may preferably be established by electronic components that are especially subjected to thermal loading being arranged alongside this bonding region in the circuit carrier, thereby allowing improved heat dissipation by way of the bonding region and the cooling device, since said region is arranged relatively close to these components.

The metallic bonding layer is preferably applied at least to certain regions on the circuit carrier as a metal paste. It is particularly preferred if this metallic bonding layer is applied to this circuit carrier as a metal paste before the individual layers of the circuit carrier are joined together with the cooling device. It proves to be particularly preferred if this metal paste is designed for reactive bonding with the ceramic circuit carrier during the process of joining the individual layers of the circuit carrier together. By this embodiment, the forming of the metallic bonding layer, and consequently the stable bond between this metal paste and the ceramic circuit carrier, can be made possible during the process of joining the individual layers of the circuit carrier together. The forming of the bond consequently no longer has to be carried out after the process of final joining together of the multilayered circuit carrier, but can be made possible concomitantly with this process, at least for a time, and consequently also under these process conditions. Much shorter fabrication, with at the same time an increase in stability and additionally improved thermal conductivity, can be achieved as a result.

The circuit carrier is preferably formed as a ceramic LTCC circuit carrier and the bonding layer is designed for creating a reactive bond with the LTCC circuit carrier during the LTCC process for bonding the individual layers and the ceramic circuit carrier.

In a particularly preferred way, the eutectic region can be produced for creating a reactive bond with the cooling device during the process for bonding the individual layers of the ceramic multilayered circuit carrier. This is advantageous in particular whenever the circuit carrier is formed as a ceramic LTCC circuit carrier and the eutectic region can be produced during the LTCC process for bonding the individual layers of the ceramic circuit carrier. The shrinkage of the ceramic material caused by the binder burnout is in this case limited to the vertical dimension by the bond with the metallic intermediate layers. As a result, better dimensional stability of the circuit carrier is achieved in comparison with the methods of limiting lateral shrinkage that are known from the prior art. Allowance is made for the different coefficients of thermal expansion of metal and ceramic by limiting the lateral expansion and/or by a suitable vertical sequence of layers.

The bond between the circuit carrier, the bonding region and the cooling device is preferably formed by a sintering process at a temperature between 840° C. and 930° C., in particular at approximately 900° C. The bond is consequently preferably achieved at a relatively low sintering temperature of approximately 900° C. by the multilayered LTCC circuit carrier having a metal paste that is LTCC-compatible, and consequently reactive in the process, printed onto it in the contact area with respect to the heat sink of the cooling device, either over the full surface area or in a specifically chosen pattern. Metal pastes of this kind may be made up, for example, of metal particles such as silver, gold, platinum or palladium as well as glass particles and organic binders. The glass content in this case ensures good adhesiveness on the functional LTCC layers of the circuit carrier. In addition, the bonding region is also formed by a eutectic region. This is produced in particular between the metal of the heat sink, which is preferably copper, and the metal of the metallic bonding layer. It may be provided with particular preference that this metallic bonding layer is an LTCC screen printing paste comprising at least silver.

The heat sink extends at least on one side laterally beyond the extent of the circuit carrier. Apart from a lateral cooling possibility, this also allows simple mounting of further component modules and/or a housing on this projecting side of the heat sink.

The electronic component module according to an embodiment of the invention allows a full-area material bond to be achieved without additives which in the prior art have to be applied after actual fabrication, for example by brazing or by an adhesive process, just by metallic reaction between metal layers and the components of the component module. As a result, lowest possible heat resistance can be made possible. This allows purely passive heat removal from the electronic component module to be achieved, without moving substances, phase boundaries or phase transitions.

This configuration of the bonding region proves to be particularly advantageous if the electronic component module has a plurality of ceramic circuit carriers, between which a plurality of cooling devices, in particular heat sinks, are formed as intermediate layers. With an integral formation of this kind, stacks of ceramic circuit carriers with integrated heat sinks in between are consequently formed. In particular in the case of such complex systems, a significant improvement with regard to stability and functionality can be ensured by the proposed electronic component module with bonding regions of this kind. Not least, it can also be made possible for such complex systems to be produced much more quickly and at lower cost. This can be achieved in particular because the forming of the entire final bonding region takes place substantially at the same time as the actual production of the bond of the multilayered circuit carrier or carriers.

In addition, efficient heat removal from buried components in the ceramic circuit carrier, in particular an LTCC circuit carrier, is also possible. Ferrites and resistors may be mentioned here as examples of components. Not least, a further advantage is based on the fact that the heat sinks can also be formed as integrated foils, in particular copper foils, and consequently can also be used as heavy-duty conductors.

The compactness and minimization of the dimensions can likewise be achieved in this way.

In the case of a method according to an embodiment of the invention for producing an electronic component module, at least one multilayered ceramic circuit carrier is formed and bonded to a cooling device with at least one heat sink. The circuit carrier and the cooling device are bonded by a bonding region, which bonding region is formed by a bonding layer formed at least in part from metal and a eutectic region. This at least two-layered system of the bonding region makes optimum attachment possible on the one hand to the circuit carrier, which is formed from a first material, and on the other hand to the cooling device, which is formed from a second material. Apart from the bond being stable, it can also be created effortlessly.

The metallic bonding layer is preferably formed before the circuit carrier is applied to the cooling device as a metal paste that is applied at least in certain regions to this circuit carrier. The eutectic region is preferably formed between the metallic bonding layer and the cooling device. It proves to be particularly preferred if the eutectic region is formed during the bonding between the circuit carrier, the bonding layer and the cooling device. The eutectic region is preferably formed by a material bond with a melting temperature lower than the process temperature at which the circuit carrier, the bonding layer and the cooling device are bonded to one another. The circuit carrier, the bonding layer and the cooling device are preferably bonded by sintering at a temperature between 840° C. and 930° C., in particular at approximately 900° C.

It proves to be particularly preferred if the circuit carrier is formed as a ceramic LTCC circuit carrier and the eutectic region is produced for creating a reactive bond with the cooling device during the LTCC process for bonding the individual layers of the ceramic circuit carrier. Consequently, at the same time as the bond between the individual layers of the ceramic circuit carrier is formed, the bonding region is also produced in its final configuration, on the one hand by the metallic bonding layer being formed for creating the reactive bond with the ceramic circuit carrier during this process and on the other hand by the eutectic region being produced during this process between the metallic bonding layer and the metallic heat sink. It proves to be particularly preferred if the metal paste, and consequently the metallic bonding layer, is formed in part from silver, and comprises particles of this kind, and the heat sink is formed at least in part from copper. This allows a eutectic region to be produced during the LTCC process for bonding the individual layers of the ceramic circuit carrier, in which for example, with a silver content of 40%, a eutectic with a melting temperature of approximately 779° C. can be formed. This can consequently form relatively easily at the preferred process temperatures of 900° C. in the case of this LTCC process. In addition, a metal paste provided with gold particles may also be provided as the metallic bonding layer, which forms a eutectic with a gold content of 43.5% and a melting temperature at approximately 889° C.

BRIEF DESCRIPTION OF THE DRAWINGS

An exemplary embodiment of the invention is explained in more detail below with reference to schematic drawings, in which.

DETAILED DESCRIPTION OF THE DRAWINGS

Figure 1:
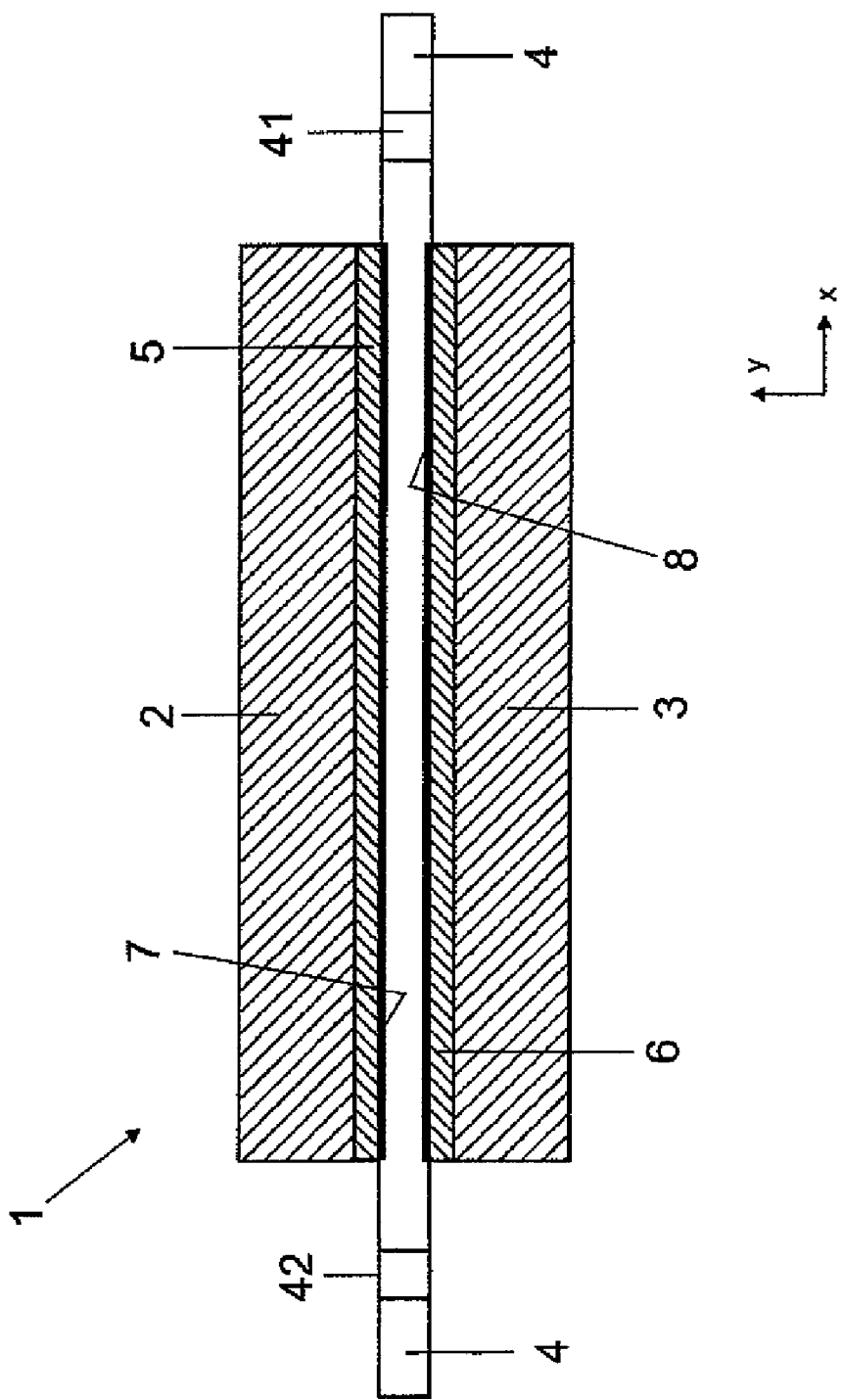
FIG. 1 shows a sectional representation through an exemplary embodiment of an electronic component module according to the invention.

According to FIG. 1, the electronic component module 1 comprises a first multilayered ceramic LTCC circuit carrier 2 and a second multilayered ceramic LTCC circuit carrier 3. These two circuit carriers 2 and 3 are arranged on opposite sides of a heat sink 4, which is assigned to a cooling device. In the exemplary embodiment, the heat sink 4 is consequently arranged integrally in the electronic component module 1 between the two circuit carriers 2 and 3. The heat sink 4 extends in the lateral direction (x direction) on both sides beyond the extent of the LTCC circuit carriers 2 and 3. In addition, bores 41 and 42 intended for fastening, in particular screwing, to further components or a housing are formed in the heat sink 4.

Formed between the upper LTCC circuit carrier 2 and the heat sink 4, which in the exemplary embodiment is formed from copper, is a first bonding layer 5, which bonds this first circuit carrier 2 to the heat sink 4 in a mechanically stable manner. In a corresponding way, a bonding layer 6 is likewise formed between the heat sink 4 and the second LTCC circuit carrier 3. Both bonding layers 5 and 6 are formed for reactive bonding with the ceramic LTCC circuit carriers 2 and 3. This means that, during the LTCC process for bonding the respective individual layers of the circuit carriers 2 and 3, the bond between the bonding layer 5 and the first circuit carrier 2 and the bond between the second bonding layer 6 and the second circuit carrier 3 is also formed.

In the exemplary embodiment, the bonding layers 5 and 6 are respectively formed over the full surface area between the heat sink 4 and the respective circuit carrier 2 and 3. It may also be provided that the bonding layers 5 and 6 are respectively only formed in certain regions. In particular, the bonding layers 5 and 6 are formed at those locations at which the greatest heat is generated on account of the arrangement of electronic components in the respective circuit carriers 2 and 3. A targeted local formation of the bonding layers 5 and 6 of this kind then allows best possible heat dissipation to take place. This heat dissipation takes place laterally in the exemplary embodiment shown.

In FIG. 1, furthermore, a first eutectic region 7 is formed between the metallic bonding layer 5 and the heat sink 4. Furthermore, a second eutectic region 8 is formed between the second metallic bonding layer 6 and the heat sink 4. Consequently, the two eutectic regions 7 and 8 in each case form subregions of the metallic bonding layer 5 and the heat sink 4 on the one hand and the metallic bonding layer 6 and the heat sink 4 on the other hand.

In the exemplary embodiment, the metallic bonding layers 5 and 6 are provided at least in part with silver particles. The heat sink 4 is formed at least in part from copper. As a result, the eutectic regions 7 and 8 can form during the LTCC process for bonding the components.

In the exemplary embodiment, the schematically shown electronic component module 1 is produced by first producing the individual layers of the circuit carriers 2 and 3 with the respective electronic components and electrical lines. Then, an LTCC-compatible metal paste is applied to, in particular printed onto, the sides of the circuit carriers 2 and 3 that are facing the heat sink 4, over the full surface area or in a specially chosen pattern. In a subsequent LTCC process, in which the respective individual layers of the circuit carriers 2 and 3 are bonded to one another, in particular laminated to one another, and then sintered, the respective bonding regions are then also produced, the first bonding region comprising the metallic bonding layer 5 and the eutectic region 7, and the second bonding region comprising the metallic bonding layer 6 and the eutectic region 8. The sintering of the circuit carriers 2 and 3 takes place at a temperature of approximately 900° C. Also formed during this process is the bond involving the creation of a reactive bond between the bonding layer 5 and the ceramic circuit carrier 2 and the creation of a reactive bond between the circuit carrier 3 and the metallic bonding layer 6. Furthermore, during this LTCC process, a reactive bond is also created between the metallic bonding layer 5 and the heat sink 4, and as a result the eutectic region 7 is formed. The forming of the eutectic region 8 takes place in a corresponding way.

Figure 2:
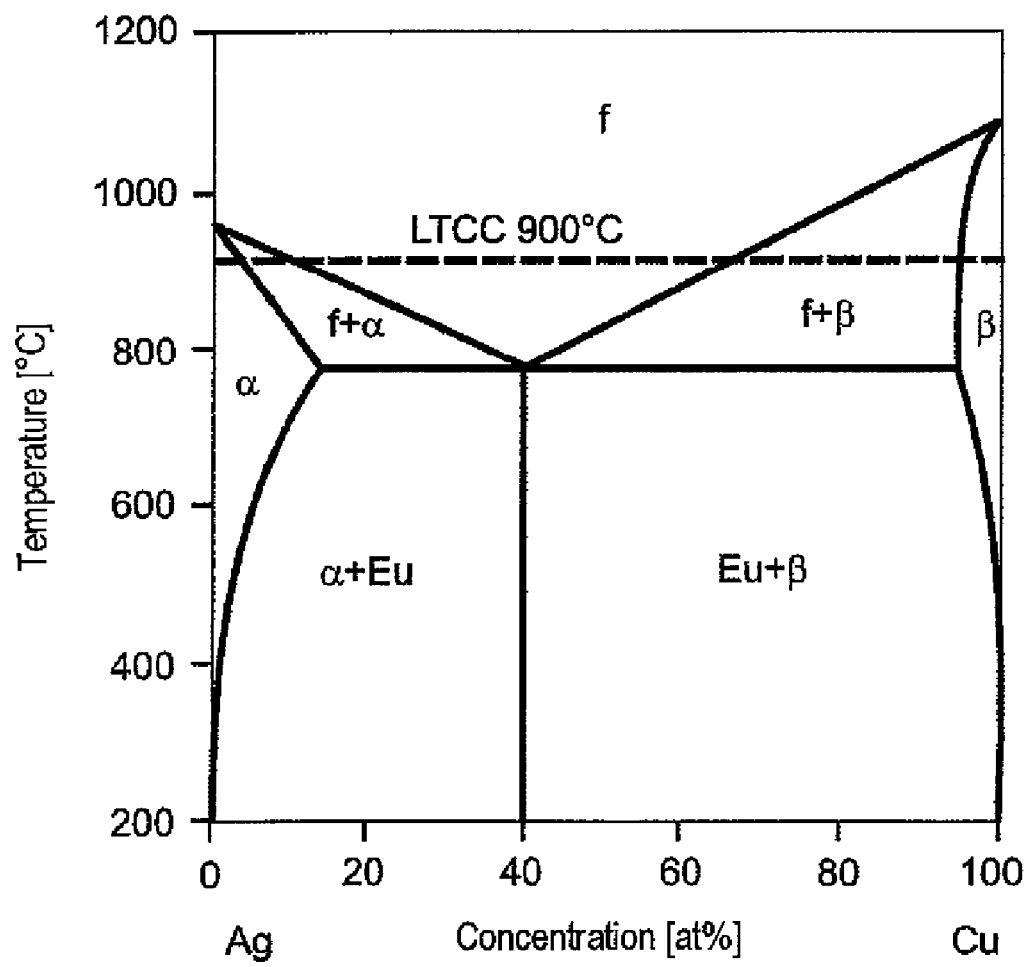
FIG. 2 shows a phase diagram for the silver-copper system for a eutectic region of the bonding region of the electronic component module.

On account of the materials chosen in the exemplary embodiment, silver-copper systems are formed as eutectic regions 7 and 8. Shown in FIG. 2 is a phase diagram for a silver-copper system of this kind, in which, with a silver content of 40% for example, a eutectic with a melting temperature of approximately 779° C. is formed. Consequently, this can easily form at the process temperature of 900° C. during the sintering.

The scope of protection of the invention is not limited to the examples given hereinabove. The invention is embodied in each novel characteristic and each combination of characteristics, which includes every combination of any features which are stated in the claims, even if this feature or combination of features is not explicitly stated in the examples.

The invention claimed is:

1. An electronic component module comprising:
   at least one ceramic circuit carrier;
   a cooling device including at least one heat sink; and
   a bonding region arranged between the ceramic circuit carrier and the cooling device adapted for bonding the circuit carrier to the cooling device, which bonding region comprises a bonding layer comprised of metal and a eutectic region arranged between the bonding layer and the cooling device.

2. The electronic component module as claimed in claim 1, wherein the bonding region is formed over the full surface area between the circuit carrier and the cooling device.

3. The electronic component module as claimed in claim 1, wherein the metallic bonding layer is applied at least to certain regions on the circuit carrier as a metal paste before the individual layers of the circuit carrier are joined together with the cooling device.

4. The electronic component module as claimed in claim 1, wherein the circuit carrier is formed as a ceramic LTCC circuit carrier.

5. The electronic component module as claimed in claim 1, wherein the circuit carrier is formed as a ceramic LTCC circuit carrier and the eutectic region is adapted for creating a reactive bond with the cooling device during the LTCC process for bonding the individual layers of the ceramic circuit carrier.

6. The electronic component module as claimed in claim 1 wherein the heat sink extends at least on one side laterally beyond the extent of the circuit carrier.

7. The electronic component module as claimed in claim 1, wherein the bond between the circuit carrier, the bonding region and the cooling device is formed by a sintering process at a temperature between 840° C. and 930° C.

8. A method for producing an electronic component module, comprising:
   forming at least one multilayered ceramic circuit carrier; and
   bonding the at least one multilayered ceramic circuit carrier to a cooling device with at least one heat sink;
   wherein the circuit carrier and the cooling device are bonded by a bonding region, which bonding region is adapted for bonding to a ceramic material and is formed by a bonding layer formed at least in part from metal and a eutectic region formed between the bonding layer and the cooling device.

9. The method as claimed in claim 8, wherein a metal-containing paste is applied to at least one of the circuit carrier and the cooling device before bonding of individual layers of the circuit carriers, and the bonding layer is formed from said paste during bonding of the individual layers of the circuit carrier.

10. The method as claimed in claim 8, wherein the eutectic region is formed during bonding of the circuit carrier, the bonding layer and the cooling device.

11. The method as claimed in claim 10, wherein the eutectic region is formed by a material bond with a melting temperature lower than a process temperature at which the circuit carrier, the bonding layer and the cooling device are bonded to one another.

12. The method as claimed in claim 10, wherein the circuit carrier the bonding layer and the cooling device are bonded by sintering at a temperature between 840° C. and 930° C.

13. The method as claimed in claim 8, wherein the circuit carrier is formed as a ceramic LTCC circuit carrier and the eutectic region is produced between the bonding layer and the cooling device for creating a reactive bond with the cooling device during the LTCC process for bonding the individual layers of the ceramic circuit carrier.

14. The method as claimed in claim 10, wherein the bonding layer is formed at least in part from glass, is applied by screen printing, and is subsequently thermally treated.

* * * * *